United States Patent
Kuo

(10) Patent No.: US 7,542,352 B1
(45) Date of Patent: Jun. 2, 2009

(54) BIT LINE PRECHARGE CIRCUIT

(75) Inventor: Chung-Shan Kuo, Taipei County (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 0 days.

(21) Appl. No.: 12/208,348

(22) Filed: Sep. 11, 2008

(51) Int. Cl.
G11C 16/06 (2006.01)
(52) U.S. Cl. ............ 365/185.25; 365/203; 365/185.21; 365/189.09; 365/185.18
(58) Field of Classification Search ............ 365/185.25, 365/203, 185.21, 189.09, 185.18
See application file for complete search history.

(56) References Cited

U.S. PATENT DOCUMENTS 7,082,069 B2 * 7/2006 Chou et al. ............ 365/203

* cited by examiner

*Primary Examiner*—Hoai V Ho
*Assistant Examiner*—Jason Lappas
(74) *Attorney, Agent, or Firm*—Jianq Chyun IP Office

(57) ABSTRACT

A bit line precharge circuit is provided by the present invention. The bit line precharge circuit groups the precharge sub-circuits to share one drain bias controller. The drain bias controller has an inverter and a NMOS clamping transistor to form a negative feedback loop, to quickly precharge bit lines. When operating in read operation, only one drain bias controller is needed. Therefore, it can greatly save the layout area and operating power consumption without any extra dummy bit line or layout expansion.

12 Claims, 5 Drawing Sheets

BIT LINE PRECHARGE CIRCUIT

BACKGROUND OF THE INVENTION

1. Field of Invention

The present invention generally relates to memory device, and more particularly to a bit line precharge circuit in the memory device.

2. Description of Prior Art

Flash memory components are experiencing a trend toward progressive miniaturization, which has currently reached the lower submicron range (0.25 µm, 0.18. µm, 0.13. µm) for the characteristic feature sizes. However, the decreasing feature sizes conflict with the requirements of a reduced supply voltage and the reduced power consumption, and with the trend toward ever higher system clock frequencies. The most significant part of a nonvolatile memory component in such a respect is the sense amplifier, because it is very important to maintain a high read access speed and a low current consumption while, at the same time, the stability of the sense amplifier remains high.

In the sense amplifiers used to date, it has been necessary to make a compromise between current consumption and access time. A short access time is normally associated with a high current consumption, and vice-versa. Some applications require a very low current consumption, and, to achieve such an aim, read access has been divided into two phases (pre-charging and sensing).

In order to complete a read operation of a flash memory, the selected bit lines must be charged to a designed voltage level before sensing starts. Therefore, if the selected bit lines are quick and accurate settled to the target level, thus sensing can be advanced.

Referring to FIG. 1, FIG. 1 is a circuit diagram of a conventional bit line precharge circuit 10. As shown in FIG. 1, the bit line precharge circuit 10 is composed of a plurality of precharge sub-circuits PC[1]~PC[n]. The precharge sub-circuit PC[i] (i.e. i is an integer from 1 to n) comprises a controllable current-voltage converter L[i], a sensed amplifier Amp[i], a memory cell Cell[i], and a drain bias controller DBC[i]. The connection of the controllable current-voltage converter L[i], the sensed amplifier Amp[i], and the drain bias controller DBC[i] is shown in FIG. 1 without describing herein.

The drain bias controller DBC[i] is coupled to a memory cell Cell[i]. The memory cell Cell[i] has a NMOS transistor N3 and an effective capacitance $C_{BL}$ of a bit line BL[i]. The controllable current-voltage converter L[i] comprises a NMOS transistor N1 and two PMOS transistor P1, P2, and the connection of the transistors N1, P1, and P2 is shown in FIG. 1 without describing herein.

It is noted that the drain bias controller DBC[i] comprises an inverter Inv and a clamping NMOS transistor N2, and the inverter Inv and the clamping NMOS transistor N2 form a negative feedback loop to control the drain bias of the clamping NMOS transistor N2. By using the negative feedback loop, the bit line BL[i] can be fast precharged to the target level, and the voltage level of the bit line BL[i] is stable without large fluctuation.

Accordingly, the conventional bit line precharge circuit stated above uses an inverter and a clamping NMOS transistor with feedback loop acting as a drain bias controller, and it provides a fast and stable bit line precharging according to the concept of negative feedback. However, as a large number of bits reading at a time, it will consume large layout area and power. For example, a page mode read function needs reading 128 bits at the same time, and thus the total 128 precharge sub-circuits (i.e. n=128 in FIG. 1) are included and are enabled.

Referring to U.S. Pat. No. 7,082,069 invented by Chou et al., Chou et al. provide a fast bit line precharge circuit without a plurality of drain bias controllers. However, it needs an extra column of memory cells as a dummy bit line and a level detector to predict the precharging is successful in current selected bit lines, but usually it is not easy to design a balanced loading on reference path and cell path, and has layout area expansion due to a extra dummy bit line and its Well to Well layout rule.

In summary, one of the conventional bit line precharge circuits may have the large area and the large power consumption, and another one of the conventional bit line precharge circuits may have the extra dummy bit line which causes the layout area expansion.

SUMMARY OF THE INVENTION

Accordingly, the present invention is directed to a bit line precharge circuit applied in the memory device, such as flash memory.

The present invention provides a bit line precharge circuit, and the bit line precharge circuit comprises a reference precharge sub-circuit and at least one precharge sub-circuit. The reference precharge sub-circuit comprises a first current mirror, a first drain bias controller, and a first current-voltage converter. The first current mirror receives a reference current and provides a first current to the first drain bias controller according to the reference current. The first drain bias controller is coupled to the first current mirror. The first drain bias controller comprises a first inverter and a first clamping NMOS transistor. Wherein a source end of the first clamping NMOS transistor is coupled to an input of the first inverter, and is used to receive the first current. An output of the first inverter is coupled to a gate end of the first clamping NMOS transistor. The first current-voltage converter is coupled to a drain end of the first clamping NMOS transistor of the first drain bias controller, and acts as a precharge PMOS transistor whose gate end is coupled to ground or as a diode load according to a precharge signal. The precharge sub-circuit comprises a second current-voltage converter, a second clamping NMOS transistor, an equalization switch, and a memory cell. The second current-voltage converter acts as a precharge PMOS transistor whose gate end is coupled to ground or as a diode load according to the precharge signal. A gate end of the second clamping NMOS transistor is coupled to the output of the first inverter, a drain end of the second clamping NMOS transistor is coupled to the second current-voltage converter and a sensed amplifier, and a source end of the second clamping NMOS transistor is coupled to one end of an equalization switch. The other one end of the equalization switch is coupled to the source end of the first clamping NMOS transistor, and the equalization switch is controlled by the precharge signal to equalize the both ends thereof. The memory cell is controlled by a word line signal, and has a bit line coupled to the source end of the second clamping NMOS transistor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
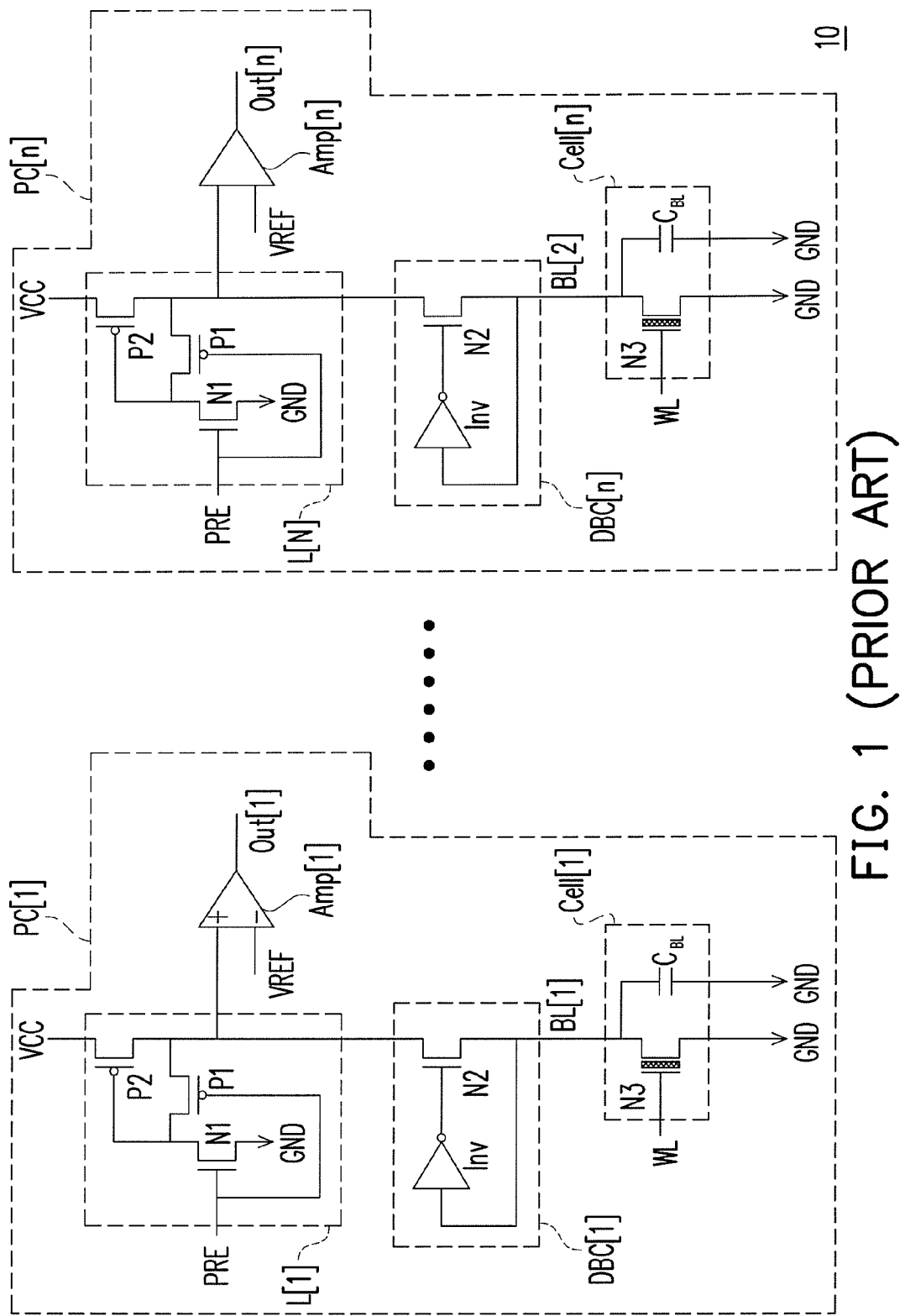
FIG. 1 is a circuit diagram of a conventional bit line precharge circuit 10.

Reference will now be made in detail to the present preferred embodiment of the invention, examples of which are illustrated in the accompanying drawings. Wherever possible, the same reference numbers are used in the drawings and the description to refer to the same or like parts.

Figure 2:
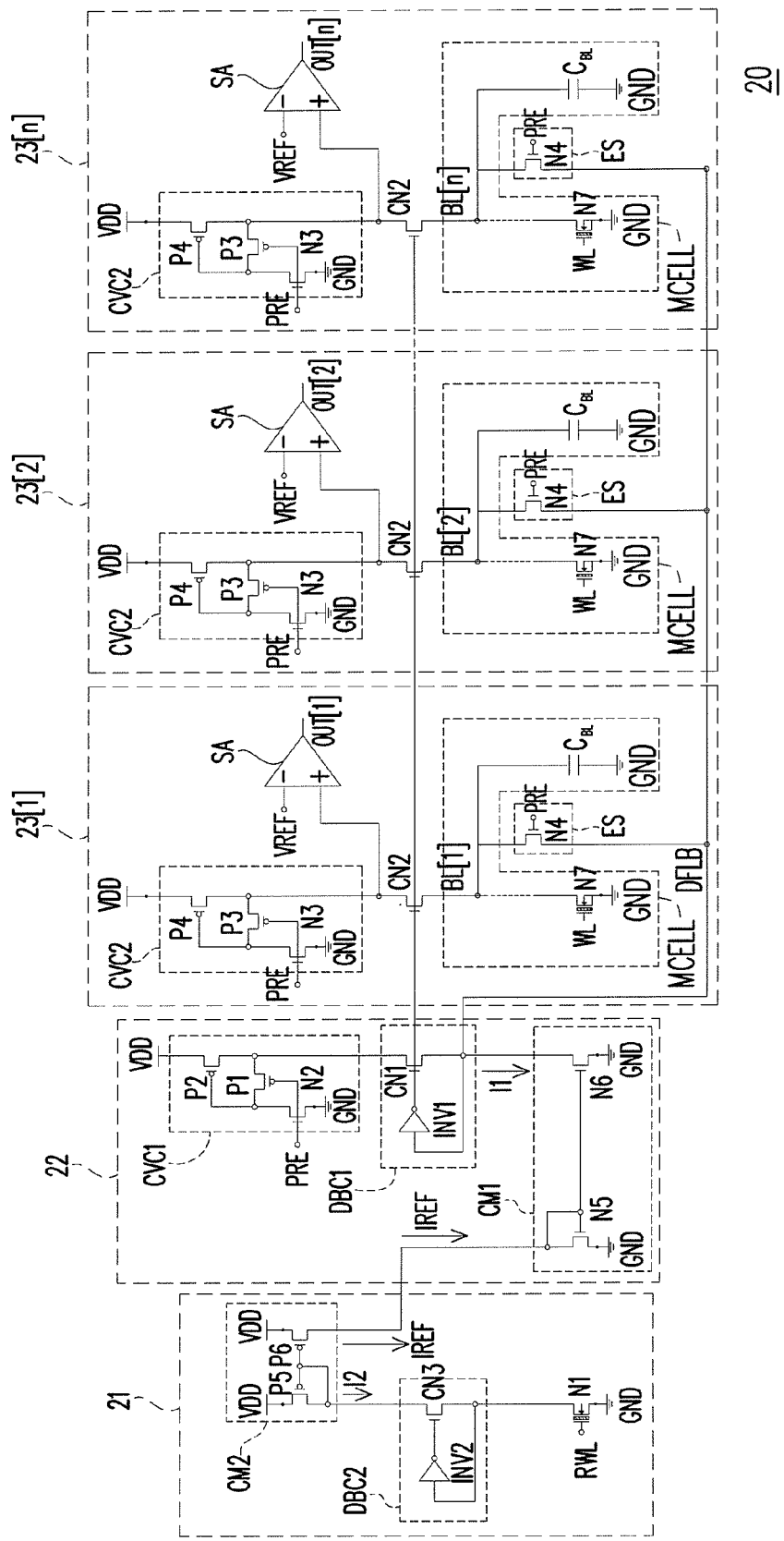
FIG. 2 is a circuit diagram of a bit line precharge circuit 20 according to an embodiment of the present invention.

Referring to FIG. 2, FIG. 2 is a circuit diagram of a bit line precharge circuit 20 according to an embodiment of the present invention. The bit line precharge circuit 20 comprises a reference precharge sub-circuit 22, a plurality of precharge sub-circuits 23[1]~23[n], and a reference current generator 21. Wherein, the reference current generator 21 is coupled to the reference precharge sub-circuit 22, and the reference precharge sub-circuit 22 is coupled to the plurality of precharge sub-circuits 23[1]~23[n]. Wherein n is a nature number.

The reference current generator 21 comprises a drain bias controller DBC2, a NMOS transistor N1, and a current mirror CM2. The drain bias controller DBC2 is coupled to a current mirror CM2, and comprises an inverter INV2 and a clamping NMOS transistor CN3. Wherein a source end of the clamping NMOS transistor CN3 is coupled to an input of the inverter INV2 and a drain end of the NMOS transistor N1, and an output of the inverter INV2 is coupled to a gate end of the clamping NMOS transistor CN3. A gate end of the NMOS transistor N1 is coupled to a reference word line signal RWL, and a source end of the NMOS transistor N1 is coupled to ground GND. The NMOS transistor N1 is a flash cell which acts as a reference cell, such as reference flash NMOS transistor. The current mirror CM2 receives a current I2 passing through the clamping NMOS transistor CN3, and outputs a reference current IREF according to the current I2.

The current mirror CM2 comprises two PMOS transistors P5 and P6. Wherein a source end of the PMOS transistor P5 is coupled to a power voltage VDD, and a drain end of the PMOS transistor P5 is coupled to a gate end thereof and a drain end of the clamping NMOS transistor CN3 to receive the current I2. A gate end of the PMOS transistor P6 is coupled to the gate end of the PMOS transistor P5, a source end of the PMOS transistor P6 is coupled to the power voltage VDD, and a drain end of the PMOS transistor P6 is coupled to the current mirror to output the reference current CM1 of the reference precharge sub-circuit 22.

Further, the reference current generator 21 may be triggered by a trigger signal ATD (not shown in FIG. 2, referring to FIG. 4), so as to provide the reference current IREF to the bit line precharge circuit 20 at the accurate time. In addition, the reference flash NMOS transistor N1 has a higher threshold voltage. However the implementations of the reference current generator 21, the current mirror CM2, and the NMOS transistor N1 in this embodiment are not used to intend the scope of the present invention.

The reference precharge sub-circuit 22 comprises a current mirror CM1, a drain bias controller DBC1, and a current-voltage converter CVC1. The current mirror CM1 receives the reference current IREF and provides a current I1 to the drain bias controller DBC1 according to the reference current IREF. The current mirror CM1 comprises two NMOS transistors N5 and N6. A source end of the NMOS transistor N5 is coupled to ground GND, and a drain end of the NMOS transistor N5 is coupled to a gate end thereof and used to receive the reference current IREF. A gate end of the NMOS transistor N6 is coupled to the gate end of the NMOS transistor N5, a source end of the NMOS transistor N6 is coupled to ground GND, and a drain end of NMOS transistor N6 is coupled to the source end of the clamping NMOS transistor CN1 to output the first current I1.

It is noted that the implementation of the current mirror CM1 is not used to limit the scope of the present invention, and people who are skilled in the art may implement the current mirror CM1 by the other implementations of the current mirror.

The drain bias controller DBC1 is coupled to the first current mirror CM1. The drain bias controller DBC1 comprises a inverter INV1 and a clamping NMOS transistor CN1. Wherein a source end of the clamping NMOS transistor CN1 is coupled to an input of the inverter INV1, and is used to receive the current I1. An output of the inverter INV1 is coupled to a gate end of the clamping NMOS transistor CN1.

The current-voltage converter CVC1 is coupled to a drain end of the clamping NMOS transistor CN1 of the drain bias controller DBC1, and acts as a precharge PMOS transistor whose gate end is coupled to ground GND (shown in FIG. 3A) or as a diode load (shown in FIG. 3B) according to a precharge signal PRE.

The current-voltage converter CVC1 comprises a NMOS transistor N2, a PMOS transistor P1, and a PMOS transistor P2. A gate end of the NMOS transistor N2 is coupled to the precharge signal PRE, and a source end of the NMOS transistor N2 is coupled to ground GND. A gate end of the PMOS transistor P1 is coupled to the precharge signal PRE, a drain end of the PMOS transistor P1 is coupled to a drain end of the NMOS transistor N2, and a source end of the PMOS transistor P1 is coupled the drain end of the clamping NMOS transistor CN1 of the drain bias controller DBC1. A gate end of the PMOS transistor P2 is coupled to the drain end of the NMOS transistor N2, a source end the PMOS transistor P2 is coupled to the power voltage VDD, and a drain end the PMOS transistor P2 is coupled to the source end of the PMOS transistor P1.

With this structure and arrangement as stated above, the current-voltage converter CVC1 acts as a precharge PMOS transistor whose gate end is coupled to ground GND (shown in FIG. 3A) or as a diode load (shown in FIG. 3B) according to a precharge signal PRE. It is noted that the implementation of the current-voltage converter CVC1 is not used to limit the scope of the present invention, and people skilled in the art may modify the current-voltage converter CVC1 or implement the current-voltage converter CVC1 with the other implementations to achieve the same function as stated above.

The precharge sub-circuit 23[i] (i.e. i is an integer from 1 to n) comprises a current-voltage converter CVC2, a clamping NMOS transistor CN2, an equalization switch ES, a sensed amplifier SA, and a memory cell MCELL. The current-voltage converter CVC2 acts as a precharge PMOS transistor whose gate end is coupled to ground GND (shown in FIG. 3A) or as a diode load (shown in FIG. 3B) according to the precharge signal PRE.

The current-voltage converter CVC2 comprises a NMOS transistor N3 and two PMOS transistors P3, P4. A gate end of the NMOS transistor N3 is coupled to the precharge signal PRE, and a source end of the NMOS transistor N3 is coupled to ground. A gate end of the PMOS transistor P3 is coupled to the precharge signal PRE, a drain end of the PMOS transistor P3 is coupled to a drain end of the NMOS transistor N3, and a source end of the PMOS transistor P3 is coupled the drain end of the clamping NMOS transistor CN2. A gate end of the PMOS transistor P4 is coupled to the drain end of the NMOS transistor N3, a source end of the PMOS transistor P4 is coupled to a power voltage VDD, and a drain end of the PMOS transistor P4 is coupled to the source end of the PMOS transistor P3.

With this structure and arrangement as stated above, the current-voltage converter CVC2 acts as a precharge PMOS transistor whose gate end is coupled to ground GND (shown in FIG. 3A) or as a diode load (shown in FIG. 3B) according to a precharge signal PRE. It is noted that the implementation of the current-voltage converter CVC2 is not used to limit the scope of the present invention, and people skilled in the art may modify the current-voltage converter CVC2 or implement the current-voltage converter CVC2 with the other implementations to achieve the same function as stated above.

A gate end of the clamping NMOS transistor CN2 is coupled to the output of the inverter INV1, a drain end of the clamping NMOS transistor CN2 is coupled to the current-voltage converter CVC2 and the sensed amplifier SA, and a source end of the clamping NMOS transistor CN2 is coupled to one end of the equalization switch ES. The other one end of the equalization switch ES is coupled to the source end of the clamping NMOS transistor CN1, and the equalization switch ES is controlled by the precharge signal PRE to equalize the both ends thereof (shown in FIG. 3A).

The equalization switch ES may be implemented by a NMOS transistor N4. Wherein a gate end of the NMOS transistor N4 is coupled to the precharge signal PRE, a drain end of the NMOS transistor N4 is coupled to the source end of the clamping NMOS transistor CN2, and a source end of the NMOS transistor N4 is coupled to the source end of the clamping NMOS transistor CN1. Further, it is noted that the implementation of the equalization switch ES is not used to limit the scope of the present invention.

The sensed amplifier SA is a differential amplifier, whose negative input of is coupled to a reference voltage VREF, and a positive input thereof is coupled to the drain end of the clamping NMOS transistor CN2. It is noted that the sensed amplifier SA may have an output latch. When a latch signal LAT (not shown in FIG. 2, but shown in FIG. 4) triggers the output latch, the sensed amplifier SA is triggered to output an amplified sensing value OUT [i] thereof.

The memory cell MCELL is controlled by a word line signal WL, and has a bit line BL[i] coupled to the source end of the clamping NMOS transistor CN2. The memory cell MCELL comprises a flash NMOS transistor N7. A gate end of the NMOS transistor N7 is coupled to the word line signal WL, a source end of the NMOS transistor N7 is coupled to ground GND, and a drain end of the NMOS transistor N7 is coupled to the bit line BL[i]. It is noted that the memory cell MCELL further has an effective load capacitance CBL coupled between the bit line BL[i] and ground GND. In addition, the NMOS transistor N7 may have a higher threshold voltage.

Accordingly, the embodiment provides a bit line precharge circuit 20 which groups the precharge sub-circuits 23[1]~23[n] to share one drain bias controller DBC2. Next, the description of the operation of the bit line precharge circuit 20 is described.

Figure 3A:
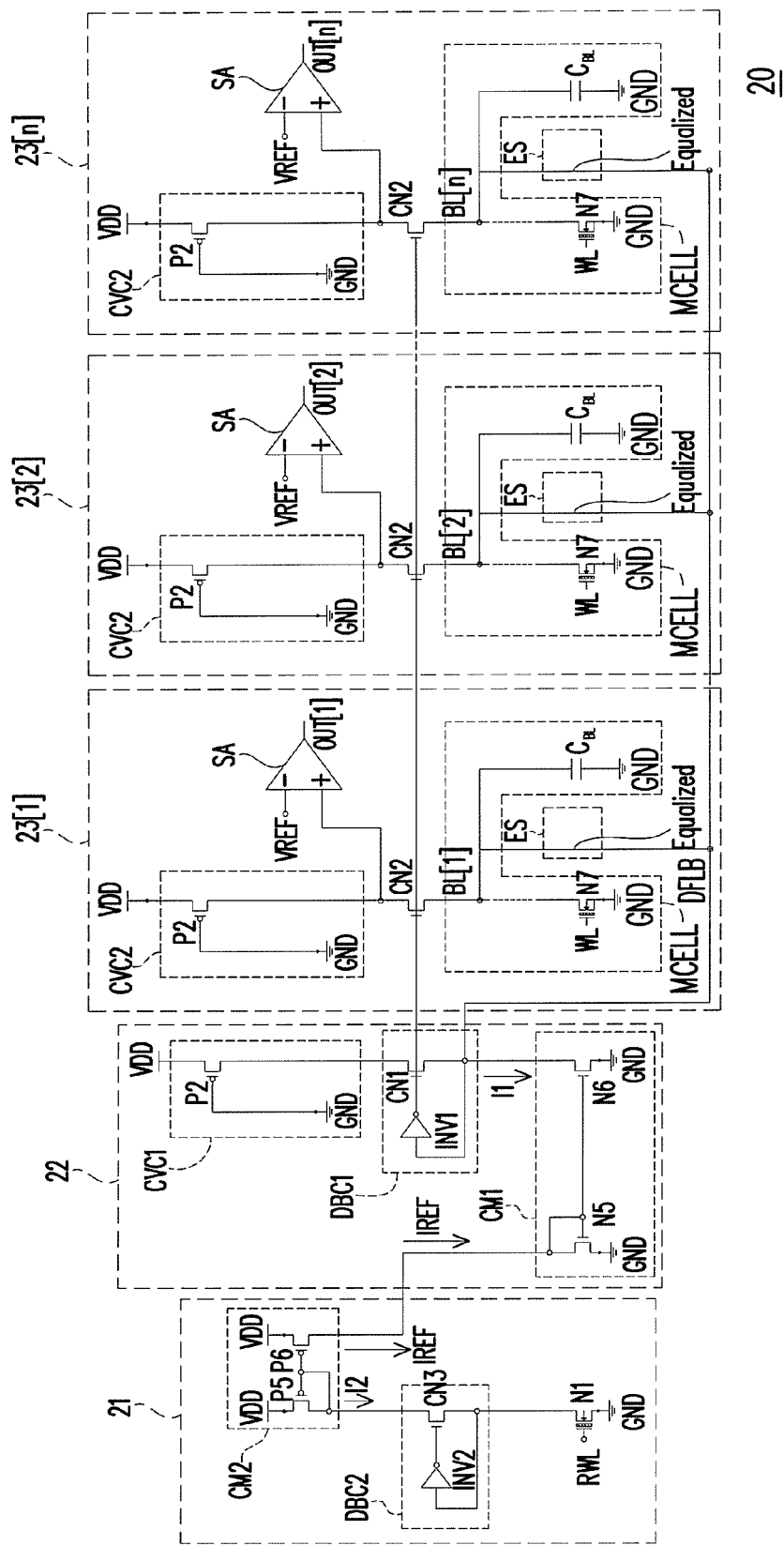
FIG. 3A is an equivalent circuit diagram of the bit line precharge circuit 20 operating in a precharging period according to an embodiment of the present invention.
Figure 3B:
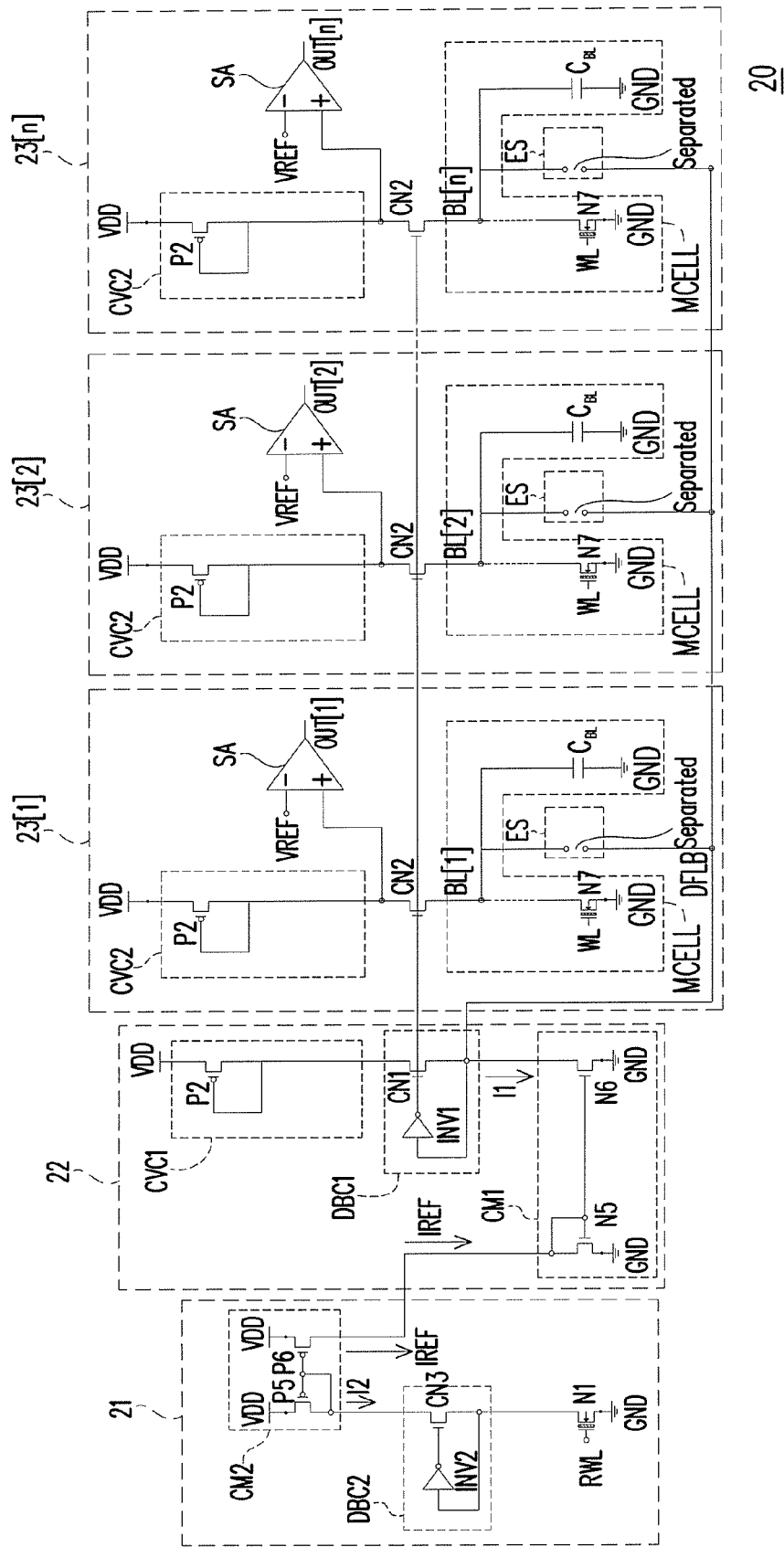
FIG. 3B is an equivalent circuit diagram of the bit line precharge circuit 20 operating in a sensing period according to an embodiment of the present invention.
Figure 4:
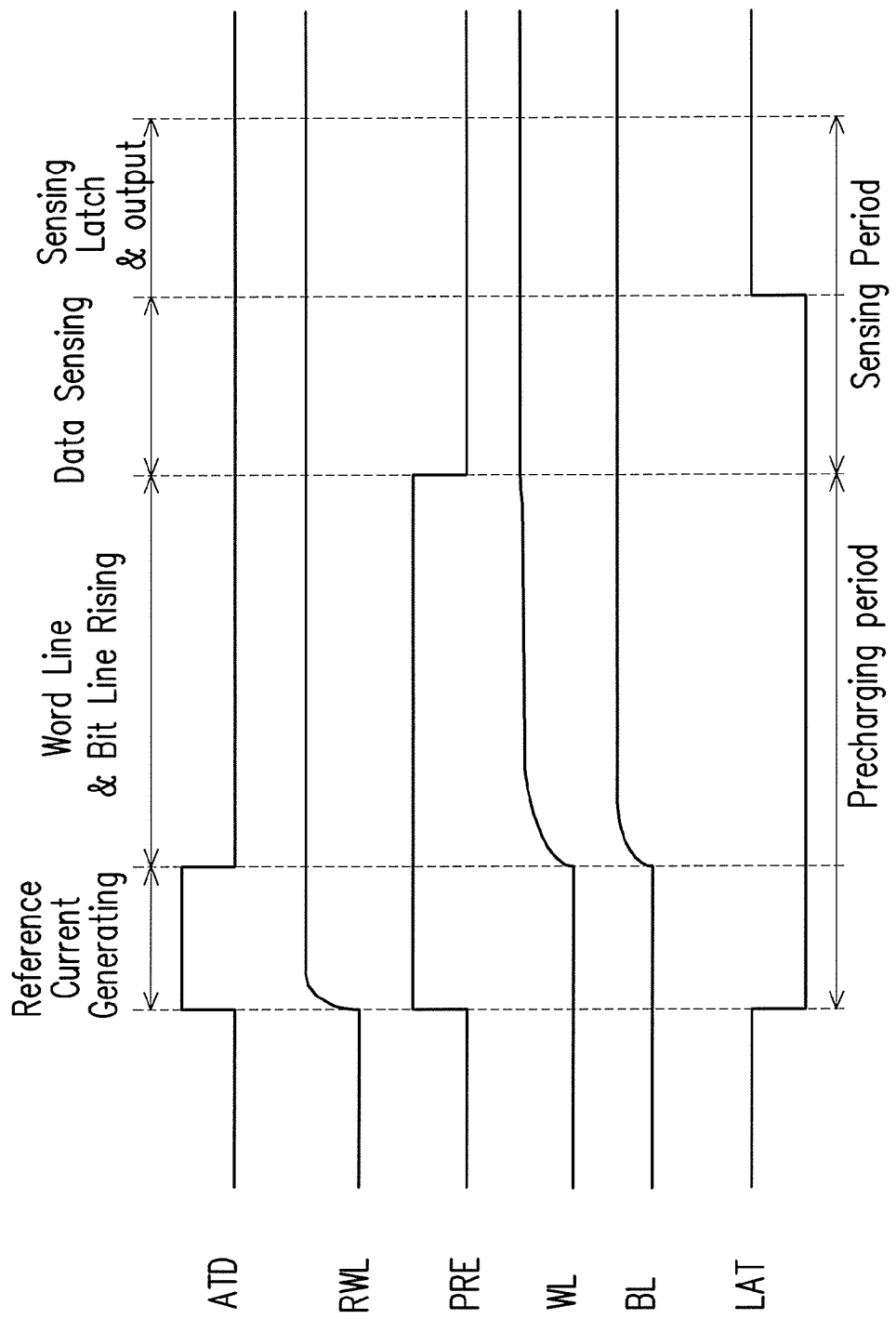
FIG. 4 is a wave diagram of the bit line precharge circuit 20 operating in a read operation.

Referring to FIGS. 3A, 3B, and 4, FIG. 3A is an equivalent circuit diagram of the bit line precharge circuit 20 operating in a precharging period according to an embodiment of the present invention, FIG. 3B is an equivalent circuit diagram of the bit line precharge circuit 20 operating in a sensing period according to an embodiment of the present invention, and FIG. 4 is a wave diagram of the bit line precharge circuit 20 operating in a read operation.

As shown in FIG. 4, the read access has been divided into two phases, the precharging period and the sensing period. In the precharging period, the precharge signal PRE is high. The trigger signal ATD changes from low to high first to trigger the reference current generator 21. The reference word line signal RWL changes from low to high to turn on the NMOS transistor N1, so as to generate the current I2. Further the drain bias controller DBC2 form a negative feed back loop, and thus the current I2 is stable. That is, using the negative feed back principle, the voltage at the gate of the clamping NMOS transistor CN3 can quickly reached a designated voltage resulting a stable current I2. The current mirror CM2 outputs the reference current IREF to the current mirror CM1. Therefore, the reference current IREF has been generated.

Next, the word line signal WL changes from low to high, and the trigger signal ATD is low. The voltage of the bit line BL[i] is precharged. In the precharging period, the NMOS transistors N2, N3 are turned on, and the PMOS transistors P2, P4 are turned on, while the PMOS transistors P1 and P3 are turned off. Therefore, the current-voltage converters CVC2 and CVC1 act as precharge PMOS transistors whose gates end are coupled to ground GND (shown in FIG. 3A). In addition, each of the equalization switch ES equalizes the both ends thereof (shown in FIG. 3A), so that all bit lines BL[1]~BL[i] are precharged to the same voltage level. That is, the equalized voltage DFLB is inputted to the input of the drain bias controller DBC1, and the output voltage of the inverter INV1 is adjusted by the negative feed back circuit, thereby the bit lines BL[1]~BL[i] are precharged quickly.

In the sensing period, the precharge signal PRE is low. The PMOS transistors P1~P4 are turned on, while the NMOS transistors N1 and N3 are turned off. Therefore, the current-voltage converters CVC1 and CVC2 act as diode loads (shown in FIG. 3B). Since it is the sensing period, the both ends of the equalization switch ES are opened and separated (shown in FIG. 3B). Next, a latch signal LAT changes from low to high to trigger the output latch of the sensed amplifier SA, and then the sensed amplifier SA outputs an amplified sensing value OUT[i] thereof.

Accordingly, the embodiment provides a bit line precharge circuit which groups the precharge sub-circuits to share one drain bias controller. The drain bias controller has an inverter and a NMOS clamping transistor to form a negative feedback loop, to quickly precharge bit lines. When operating in read operation, only one drain bias controller is needed. Therefore, it can greatly save the layout area and operating power consumption without any extra dummy bit line or layout expansion.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A bit line precharge circuit, comprising:
a reference precharge sub-circuit, comprising:
a first current mirror, receiving a reference current and providing a first current to a first drain bias controller according to the reference current;
the first drain bias controller, coupled to the first current mirror, comprising a first inverter and a first clamping NMOS transistor, wherein a source end of the first clamping NMOS transistor is coupled to an input of the first inverter and used to receive the first current, and an output of the first inverter is coupled to a gate end of the first clamping NMOS transistor; and
a first current-voltage converter, coupled to a drain end of the first clamping NMOS transistor of the first drain bias controller, acting as a precharge PMOS transistor whose gate end is coupled to ground or acting as a diode load according to a precharge signal; and
at least one precharge sub-circuit, comprising:
a second current-voltage converter, acting as a precharge PMOS transistor whose gate end is coupled to ground or acting as a diode load according to the precharge signal;
a second clamping NMOS transistor, a gate end thereof is coupled to the output of the first inverter, a drain end thereof is coupled to the second current-voltage converter and a sensed amplifier, and a source end thereof is coupled to one end of an equalization switch;
the equalization switch, the other one end thereof is coupled to the source end of the first clamping NMOS transistor, controlled by the precharge signal to equalize the both ends thereof; and
a memory cell, controlled by a word line signal, having a bit line coupled to the source end of the second clamping NMOS transistor.

2. The bit line precharge circuit according to claim 1, further comprising:
a reference current generator, comprising:
a second drain bias controller, coupled to a second current mirror, comprising a second inverter and a third clamping NMOS transistor, wherein a source end of the third clamping NMOS transistor is coupled to an input of the second inverter and a drain end of a first NMOS transistor, and an output of the second inverter is coupled to a gate end of the third clamping NMOS transistor;
the first NMOS transistor, a gate end thereof is coupled to a row word line signal, and a source end thereof is coupled to ground; and
the second current mirror, receiving a second current passing through the third clamping NMOS transistor, and outputting the reference current according to the second current.

3. The bit line precharge circuit according to claim 1, wherein the first current-voltage converter comprises:
a second NMOS transistor, a gate end thereof is coupled to the precharge signal, and a source end thereof is coupled to ground;
a first PMOS transistor, a gate end thereof is coupled to the precharge signal, a drain end thereof is coupled to a drain end of the second NMOS transistor, and a source end thereof is coupled to the drain of the first clamping NMOS transistor of the first drain bias controller; and
a second PMOS transistor, a gate end thereof is coupled to the drain end of the second NMOS transistor, a source end thereof is coupled to a power voltage, and a drain end thereof is coupled to the source end of the first PMOS transistor.

4. The bit line precharge circuit according to claim 1, wherein the precharge sub-circuit further comprises:
the sensed amplifier, a negative input thereof is coupled to a reference voltage, and a positive input thereof is coupled to the drain end of the second clamping NMOS transistor.

5. The bit line precharge circuit according to claim 1, wherein the second current-voltage converter comprises:
a third NMOS transistor, a gate end thereof is coupled to the precharge signal, and a source end thereof is coupled to ground;
a third PMOS transistor, a gate end thereof is coupled to the precharge signal, a drain end thereof is coupled to a drain end of the third NMOS transistor, and a source end thereof is coupled the drain end of the second clamping NMOS transistor; and
a fourth PMOS transistor, a gate end thereof is coupled to the drain end of the third NMOS transistor, a source end thereof is coupled to a power voltage, and a drain end thereof is coupled to the source end of the third PMOS transistor.

6. The bit line precharge circuit according to claim 1, wherein the equalization switch is a fourth NMOS transistor, wherein a gate end thereof is coupled to the precharge signal, a drain end thereof is coupled to the source end of the second clamping NMOS transistor, and a source end thereof is coupled to is coupled to the source end of the first clamping NMOS transistor.

7. The bit line precharge circuit according to claim 1, wherein the first current mirror comprises:
a fifth NMOS transistor, a source end thereof is coupled to ground, and a drain end thereof is coupled to a gate end thereof and used to receive the reference current; and
a sixth NMOS transistor, a gate end thereof is coupled to the gate end of the fifth NMOS transistor, a source end thereof is coupled to ground, and a drain end thereof is coupled to the source end of the first clamping NMOS transistor to output the first current.

8. The bit line precharge circuit according to claim 2, wherein the second current mirror comprises:
a fifth PMOS transistor, a source end thereof is coupled to a power voltage, and a drain end thereof is coupled to a gate end thereof and a drain end of the third clamping NMOS transistor to receive the second current; and
a sixth PMOS transistor, a gate end thereof is coupled to the gate end of the fifth PMOS transistor, a source end thereof is coupled to the power voltage, and a drain end thereof is coupled to the first current mirror to output the reference current.

9. The bit line precharge circuit according to claim 1, wherein the memory cell comprises:
a seventh NMOS transistor, a gate end thereof is coupled to the word line signal, a source end thereof is coupled to ground, and a drain end thereof is coupled to the bit line.

10. The bit line precharge circuit according to claim 2, wherein the first NMOS transistor is a flash NMOS transistor.

11. The bit line precharge circuit according to claim 9, the seventh NMOS transistor is a flash NMOS transistor.

12. The bit line precharge circuit according to claim 1, wherein, in a precharging period, the precharge signal is high and the word line signal changes from low to high, the bit line is precharged to a target level; and in a sensing period, the precharge signal is low, and when a latching signal changes from low to high, the sensed amplifier is triggered to output an amplified sensing value thereof.

* * * * *